United States Patent [19]

Buynak et al.

[11] 4,112,134
[45] Sep. 5, 1978

[54] VACUUM DEPOSITION METHOD FOR FREQUENCY ADJUSTMENT OF PIEZOELECTRIC RESONATORS

[75] Inventors: Gabriel Ralph Buynak, Cleveland; Franz Ludwig Sauerland, Shaker Heights, both of Ohio

[73] Assignee: Transat Corp., Shaker Heights, Ohio

[21] Appl. No.: 669,328

[22] Filed: Mar. 22, 1976

[51] Int. Cl.² .................... B05D 5/12; C23C 13/04
[52] U.S. Cl. ................................. 427/10; 29/25.35; 427/100; 427/124; 427/248 R; 427/250
[58] Field of Search ............. C23C/13/02; 427/8, 10, 427/100, 124, 250, 248 R

[56] References Cited

U.S. PATENT DOCUMENTS

| 2,123,227 | 7/1938 | Bieling | 427/8 |
| 2,978,364 | 4/1961 | Blaustein | 427/10 |
| 3,383,238 | 5/1968 | Unzicker et al. | 427/10 |
| 3,400,014 | 9/1968 | Blumberg et al. | 427/10 |
| 3,486,217 | 12/1969 | Congleton et al. | 427/250 |
| 3,498,818 | 3/1970 | Bahm et al. | 427/250 |
| 3,549,414 | 12/1970 | Curran et al. | 427/100 |
| 3,573,960 | 4/1971 | Duncan | 427/100 |

*Primary Examiner*—George F. Lesmes
*Assistant Examiner*—R. Eugene Varndell, Jr.

[57] ABSTRACT

Vacuum deposition method for adjusting the resonant frequency of piezoelectric resonators wherein the speed and accuracy of the process are enhanced by abrupt termination of the deposition through injection of a gas into the vacuum chamber at the end of the adjustment cycle.

2 Claims, 1 Drawing Figure

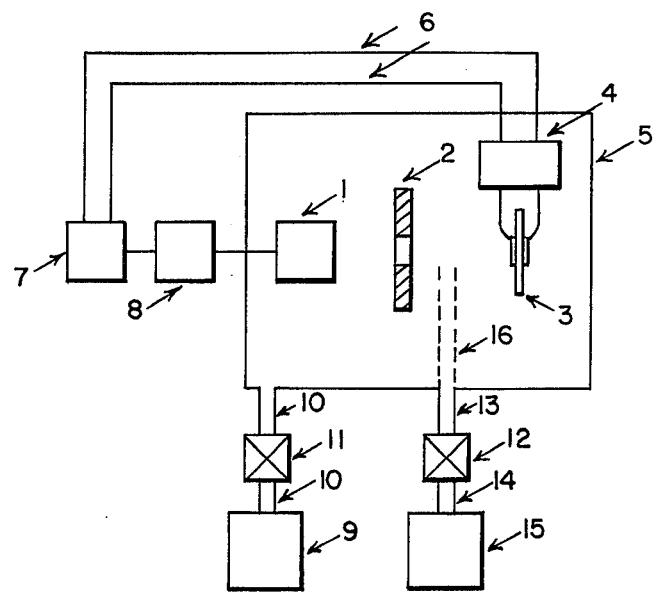

VACUUM DEPOSITION METHOD FOR FREQUENCY ADJUSTMENT OF PIEZOELECTRIC RESONATORS

The invention relates to a vacuum deposition method for adjusting the resonant frequency of piezoelectric resonators wherein the speed and accuracy of the process are enhanced by abrupt termination of the deposition through injection of a gas into the vacuum chamber at the end of the adjustment cycle.

In the vacuum deposition process, a conductive or nonconductive material is evaporated in vacuum and deposited on the surface of a piezoelectric resonator, thereby lowering its resonance frequency FR toward a desired target frequency FT. A basic conventional system may comprise a vacuum chamber containing an electrically heated filament wire for evaporating the deposition material, a mask for establishing a deposition pattern, and a resonator plus socket and electrical connections for monitoring the resonance frequency. The adjustment can be done by turning off the filament current when FR equals FT. However, due to the thermal inertia of filament and deposition material, the deposition cannot turn off immediately and causes FR to "overshoot" FT. The resulting adjustment error increases with the deposition rate at the time of filament turnoff. As a consequence, high operating speed and accuracy — two of the most important performance criteria — are mutually exclusive in this basic system.

There are several known ways to improve the performance. One approach is to control the deposition rate from an initial high rate to a low rate as the resonator frequency approaches the target frequency. Another is to interject a shutter between the filament and resonator at the end of the adjustment cycle. Some systems combine both of these approaches.

The shutter has several drawbacks, among them (A) movable parts partially exposed to material deposition and therefore in need of periodic cleaning and repair, (B) complexity and bulk inside the vacuum chamber, which for reasons of fast and economical pumpdown should be small, (C) added feedthroughs — either mechanical or electrical — through the vacuum chamber wall, (D) an adjustment error due to mechanical inertia of the shutter and (E) an adjustment error due to the deposition of the vapor that at the time of shutter closing is trapped between the shutter and the resonator and moving toward the latter. These drawbacks are overcome by the present invention.

The present invention is based on abruptly terminating deposition when FR equals FT by releasing the vacuum and injecting a gas — preferably inert — into the vacuum chamber. The method can be implemented by a modification of conventional frequency adjustment methods. Its advantages are a combination of high speed, high accuracy performance with simplicity of operation.

For a better understanding of the invention, reference is made to the FIGURE which shows a schematic diagram of a frequency adjustment system. In this diagram there are shown a source for vapor deposition 1, a mask 2, a resonator 3, and a network 4 with electrical connections to the resonator assembled in a vacuum chamber 5. The source 1 may comprise the deposition material, heated by a electrically heated filament. The network 4 may in its simplest form comprise two wires directly connecting the resonator to the electrical conductors 6 which interconnect network 4 with the control circuit 7. The control circuit serves to compare the resonator frequency FR to the target frequency FT and to control the current supply 8 which supplies current to the source 1 and thereby controls the deposition rate of source 1. A vacuum pump 9 is connected to the vacuum chamber 5 via the pipe 10 and valve 11. Also a vent valve 12 is connected to the vacuum chamber 5 via pipe 13 on one side and to pipe 14 on the on the other side. Pipe 14 is connected to a vessel 15 which usually is open to the surrounding air.

The system described so far is conventional. A typical operating cycle comprises the following steps: (a) insert a resonator, (b) close the vacuum chamber, close valve 12, open valve 11, and pump down; (c) initiate deposition by turning on the filament current; (d) turn off the filament current when $|FR - FT|$ reaches a given value, usually zero; (e) after deposition has stopped, close valve 11 and open valve 12 to vent the chamber; (f) take out the finished resonator.

In the conventional method, a small amount of deposition continues after the filament has been turned off. This is due to the thermal inertia of the deposition material and filament and causes adjustment errors.

To implement the method according to the invention, the timing in operating the valves 11 and 12 is changed such that valve 12 is opened when $|FR - FT|$ reaches a given value — usually zero — and that valve 11 is closed before that. Also vessel 14 preferably contains an inert gas. Further, an extension 16 may be added to pipe 13, thereby extending the venting orifice into the area between deposition source 1 and resonator 3.

A typical operating cycle according to the invention comprises steps a, b, c described before for the conventional approach and continues with: (d) turn off valve 11; (e) turn off the filament current when $|FR - FT|$ reaches a given value, usually zero; (f) open vent valve 12 when $|FR - FT|$ reaches another given value, usually zero; (g) take out the finished resonator.

Upon venting the vacuum chamber in step (e), the deposition is stopped almost instantaneously. Venting with air is usually not desirable because it may oxydize the deposition material and the filament, both of which are still hot at the instant. For this reason, vessel 15 is preferably filled with an inert gas at pressure around or above atmospheric pressure. Even more immediate suppression of the deposition may be obtained by placing the venting orifice in the area between deposition source 1 and resonator 3, as indicated in the FIGURE.

A number of tests have been made comparing the performance of the new method to that of the conventional method. A system according to the FIGURE was used, with circuit 7 replaced by commercial control equipment (Plating Rate Controller Model PRC, Transat Corp.). A batch of 12 MHz resonators was adjusted by following the steps a through f outlined above for the conventional approach. Another batch of 12 MHz resonators was adjusted by following the steps a through g outlined for the method according to the invention — under the following conditions: the vessel 15 was filled with nitrogen at about 1 psi above atmospheric pressure; no extended venting line like part 16 in the FIGURE was used; valve 12 of the FIGURE was solenoid operated and opened automatically when FR = FT. All operational parameters were kept unchanged through the experiments, except for the methodical differences explained above. Ten runs were made for each batch, with plateback — i.e. the frequency interval covered during the adjustment — ranging from 1 to 40 KHz and adjustment times — i.e. the time elapsed between turning on the filament and terminating the adjustment — between 4 and 9 seconds. The new method yielded accuracies better than ±0.7 ppm (parts per million) at an average overshoot of 1.3 ppm. The conventional method yielded accuracies of ±7 ppm at an average overshoot of 16 ppm. This confirms the superiority of the new method over the conventional method.

The advantages of the present invention are derived from the novel and deliberate timing in operating the valves 11 and 12, with the purpose and effect of an abrupt termination of the deposition. This is a distinct difference from conventional methods where the vacuum chamber is vented only after the deposition has subsided. An additional and preferable feature is the use of an inert gas for venting. Another additional feature is the vent extension 16 shown in the FIGURE.

While there have been described what are at present considered to be the preferred embodiments of this invention, it will be obvious to those skilled in the art that various changes and modifications may be made therein without departing from the invention, and it is aimed, therefore, in the appended claims to cover all such changes and modifications as fall within the true spirit and scope of the invention.

What is claimed is:

1. Method for adjusting the resonant frequency FR of a piezo-electric resonator to a target frequency FT comprising:
   (a) vapor depositing a material in a vacuum chamber for changing said resonant frequency of said resonator;
   (b) monitoring said resonant frequency during the deposition process;
   (c) continuing the deposition until $|FR - FT|$ equals a predetermined value and then injecting an inert gas into the vacuum chamber to terminate the deposition.
2. Method according to claim 1 where said gas is injected through an orifice located in the area between the source of the deposition vapor and the resonator.

* * * * *